United States Patent [19]

Yokota et al.

[11] Patent Number: 5,236,556
[45] Date of Patent: Aug. 17, 1993

[54] PLASMA APPARATUS

[75] Inventors: Takashi Yokota, Yokohama; Shiro Koyama, Fuchu; Isahiro Hasegawa, Zushi; Haruo Okano, Tokyo, all of Japan

[73] Assignees: Tokyo Electron Limited, Tokyo; Kabushiki Kaisha Toshiba, Kawasaki, both of Japan

[21] Appl. No.: 732,912

[22] Filed: Jul. 19, 1991

[30] Foreign Application Priority Data

Jul. 20, 1990 [JP] Japan .................................. 2-192471

[51] Int. Cl.$^5$ .............................................. C23F 1/00
[52] U.S. Cl. ........................... 204/298.32; 204/192.33; 204/298.37; 156/345
[58] Field of Search .................. 204/192.32, 192.33, 204/192.13, 298.31, 298.32, 298.03; 156/345

[56] References Cited

U.S. PATENT DOCUMENTS 4,846,928 7/1989 Dolins et al. ............... 204/192.33 X
5,097,430 3/1992 Birang ........................ 204/298.32 X Primary Examiner—Nam X. Nguyen
Attorney, Agent, or Firm—Oblon, Spivak, McClelland, Maier & Neustadt

[57] ABSTRACT

A plasma generating section generates a plasma in a process vessel. A plasma process section executes a plasma process to a substance to be processed by moving the plasma generated by the plasma generating section. A sensor section outputs an electrical signal corresponding to the intensity of plasma light having a predetermined wavelength in the plasma when the plasma process is executed by the plasma process section. A smoothing section smooths the electrical signal output from the sensor section. A end-point detecting section detects an end-point of the plasma process in accordance with the signal smoothed by the smoothing section.

11 Claims, 4 Drawing Sheets

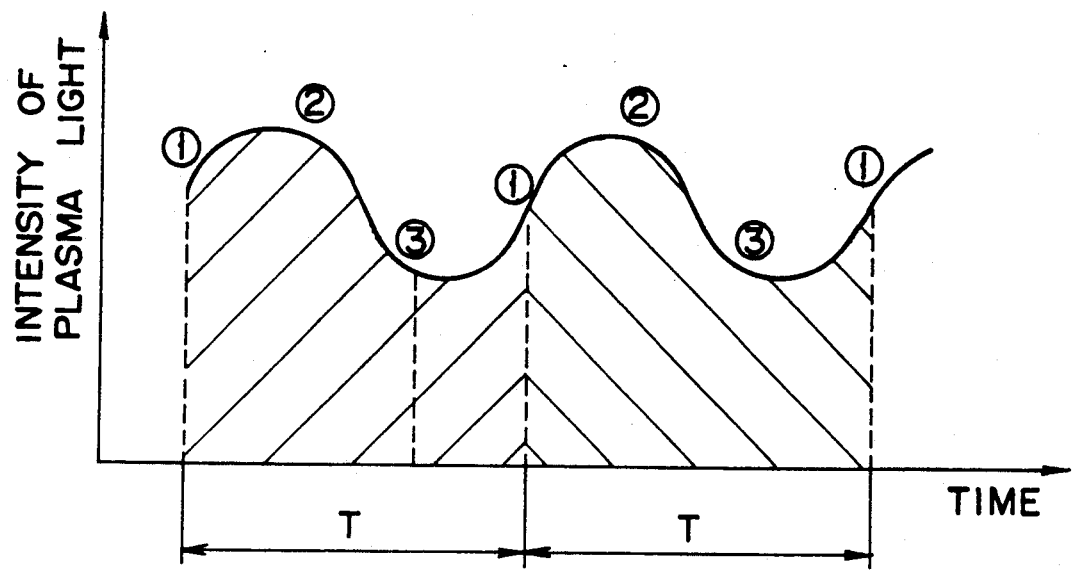
F I G. 2
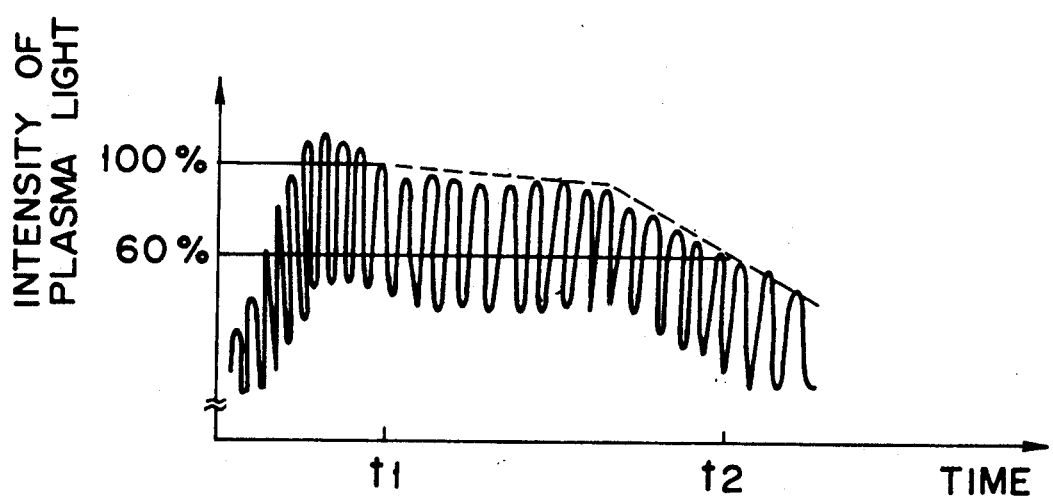
F I G. 3

PLASMA APPARATUS

BACKGROUND OF THE INVENTION

1. Field of the Invention

The present invention generally relates to a plasma apparatus and, more particularly, to a plasma apparatus having an end-point detecting system utilizing an intensity variation of plasma light in a plasma process such as a plasma etching to a semiconductor wafer.

2. Description of the Related Art

In recent years, the high packing density and high integration of a semiconductor circuit device, typically, a dynamic random access memory (DRAM) are developing. Manufacturing of 16M bits DRAM is already stared and developing of 64M bits DRAM is prepared.

In the manufacturing process of such a semiconductor integration circuit device, micropatterning process technique plays an important role. Especially, plasma etching is employed as one of dry etching techniques. In the plasma etching technique, there is an apparatus based on the phenomenon that ions, molecules, or the like in a plasma generated by an electrical discharge in a low vacuum react with a substance (to be etched) to produce a volatile substance.

Such plasma etching process exhibits an excellent anisotropic etching effect in comparison with conventional wet etching, and hence is suitable for a micropatterning technique for forming grooves, each having a line width on the order of microns or less and a predetermined depth.

It is, therefore, very important for the manufacturing process of a semiconductor integration circuit device to detect an end-point of etching in plasma etching. As an apparatus for detecting an end-point of etching, an apparatus based on so-called emission spectrochemical analysis is generally used. In this apparatus, plasma light is converted into an electrical signal by a light-receiving element arranged at a transparent window portion of an etching chamber, and the electrical signal is monitored. That is, this analysis is performed by monitoring an intensity variation of light having a specific wavelength dependent on a volatile substance produced by etching.

More specifically, when plasma etching is started, a volatile substance is increased in amount, and a steady state is immediately set. However, as the etching process comes closer to an end, the volatile substance is decreased in amount, thus causing an intensity variation of light having a specific wavelength over time. An end-point is detected from this intensity variation.

For example, in a magnetron plasma etching apparatus as one of manufacturing apparatus of semiconductor integration circuit devices, a magnetic field is formed to cross an electric field formed between parallel electrodes for inducing a plasma discharge to obtain a high etching rate (about 1 $\mu$m/min) thereby generating a plasma at a low pressure (about 10-3 norr).

As described above, detection of a plasma process end-point is indispensable to an etching apparatus of this type. For this reason, a transparent window portion is arranged on a process chamber in which a plasma is generated, and a plasma process end-point detecting apparatus (EPD) including a sensor for converting light having a specific wavelength into an electrical signal is arranged to oppose this window portion. The EPD detects the intensity of light having a specific wavelength during plasma emission, and detects a plasma process end-point when the intensity of the light having the specific wavelength is decreased to 60%, for example, provided that the intensity of the light is 100% in a steady state of the plasma process. In this case, since the time required for this detection is about 1 to 2 minutes, which is relatively long, a problem is posed in terms of error factors such as a variation.

In some magnetron plasma etching apparatus of this type, in order to improve etching characteristics, a magnet as a magnetic field forming means is rotated to form a uniform magnetic field so as to uniformity process in a surface of a wafer. In such an apparatus in which a plasma is generated in a rotating magnetic field, it is found that if a conventional EPD is directly applied to detection of a plasma process end-point, since a plasma is moved upon rotation of a magnetic field, a plasma process end-point cannot be accurately detected.

More specifically, since a plasma is moved upon rotation of a magnetic field, even if plasma process end-point detection is performed by detecting the intensity of light having a specific wavelength in the plasma by means of the EPD at a specific position, a detection timing may be offset. This is because the intensity variation of the plasma light is moved, and this variation is generally detected only once per rotation of the magnetic field.

Note that the above description is associated with a magnetron plasma etching apparatus. With regard to plasma process end-point detection in a normal plasma etching apparatus, the same problem as described above is posed. That is, accurate end-point detection information cannot be always obtained because of an uneven plasma light distribution.

SUMMARY OF THE INVENTION

It is, therefore, an object of the present invention to provide a new and improved plasma apparatus which can precisely detect a plasma process end-point.

According to one aspect of the present invention, there is provided a plasma apparatus comprising:

plasma generating means for generating a plasma in a process vessel;

plasma process means for executing a plasma process to a substance to be processed by moving the plasma generated by the plasma generating means;

sensor means for outputting an electrical signal corresponding to an intensity of plasma light having a predetermined wavelength within the plasma when the plasma process is executed by the plasma process means;

smoothing means for smoothing the electrical signal output from the sensor means; and end-point detecting means for detecting an end-point of the plasma process in accordance with the signal smoothed by the smoothing means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention

FIG. 2 is a graph showing, in an enlarged scale, a variation component of the intensity of plasma light having a specific wavelength which is output from a light-receiving sensor in FIG. 1;

FIG. 3 is a graph showing a change in intensity of plasma light having a specific wavelength, which is output from the light-receiving sensor in FIG. 1, as a function of time;

DETAILED DESCRIPTION OF THE PREFERRED EMBODIMENTS

Reference will now be made in detail to the presently preferred embodiments of the invention as illustrated in the accompanying drawings, in which like reference characteristics designate like or corresponding parts throughout the several drawings.

The present invention will be briefly described first.

The reason why plasma process end-point detection cannot be accurately performed in a process chamber during movement, e.g., rotation, of a magnetic field is as follows. That is, since a plasma is moved upon rotation of the magnetic field, the detection value of the intensity of plasma light greatly varies at a fixed observation point, and an output signal from a sensor for photoelectrically converting light having a specific wavelength exhibits a waveform as shown in FIG. 3 which includes a frequency component synchronized with the rotation of the magnetic field.

If a plasma process end-point is to be directly detected by using such an output signal, a correct plasma process end-point cannot be detected, but a plasma process end-point may be determined on the basis of a variation component of a light-emitting portion of plasma light or an uneven plasma light distribution.

In the present invention, therefore, after the intensity of light having a specific wavelength in a plasma is detected by a sensor such as a monochromator, the detection output is smoothed by electrical signal processing, and a plasma process end-point is detected on the basis of the smoothed signal (see a dotted line in FIG. 3). With this operation, an error in plasma process end-point detection due to a variation component of the intensity of plasma light or an uneven plasma light distribution can be reduced.

An embodiment in which the present invention based on the above principles is applied to etching end-point detection in a magnetron plasma etching apparatus will be described in detail below with reference to the accompanying drawings.

The magnetron plasma etching apparatus will be briefly described with reference to FIG. 4.

Figure 4:
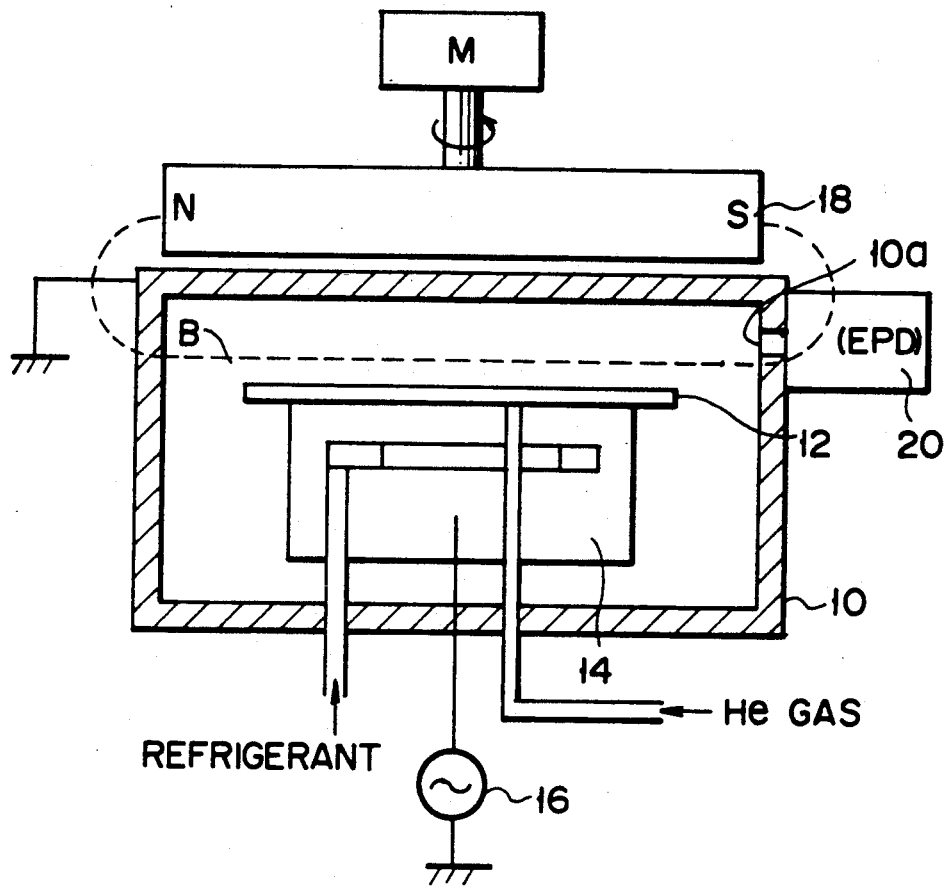
FIG. 4 is a schematic sectional view showing a magnetron plasma etching apparatus to which the present invention is applied.
Figure 5:
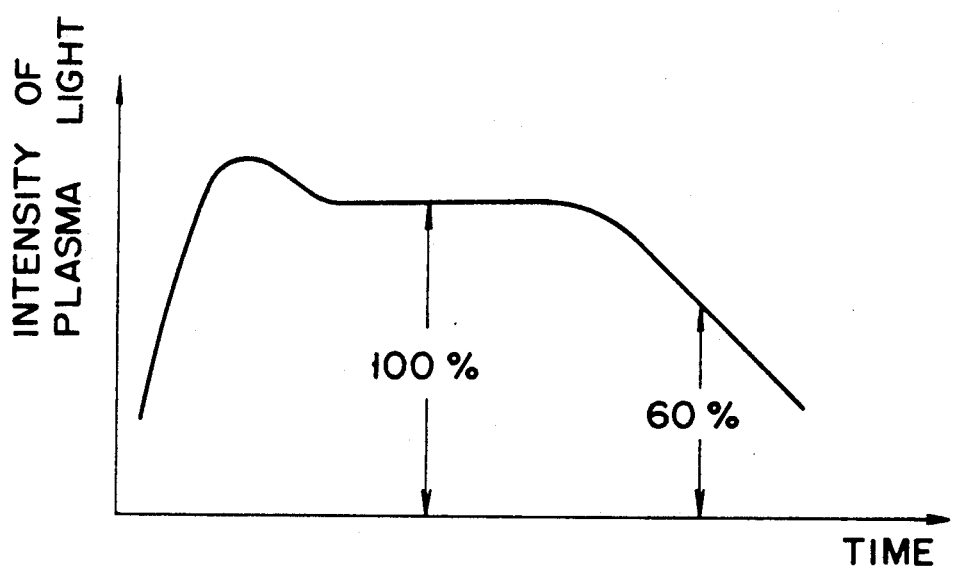
FIG. 5 is a graph for explaining the principle of plasma process end-point detection.

Referring to FIG. 4, a mount table 14 serving as a first electrode on which a wafer 12 is mounted is arranged in an airtight vessel, e.g., a process chamber 10, which can be evacuated to a predetermined pressure by a means (not shown), similar to a conventional apparatus, and in which an etching gas can be introduced and a volatile substance formed by etching can be exhausted. A radio frequency (RF) power source 16 is connected to the first electrode provided with the mount table 14. The RF power source 16 outputs RF power of industrial use having a frequency of, e.g., 2.45 GHz, 13.75 kHz, or 358 kHz with an amplitude required for generating a plasma. The process chamber 10 is grounded so that a top plate portion of the process chamber 10 serves as a second electrode. The top plate portion as the second electrode and the mount table 14 as the first electrode constitute parallel flat electrodes of a cathode coupling (RIE) scheme. With this arrangement, a plasma can be generated between the parallel flat electrodes to oppose the wafer 12 by turning on the RF power source 16. The RF power is relatively supplied between the first and second electrodes.

Furthermore, in this embodiment, in order to perform uniform etching with high anisotropy, for example, a magnet 18 is arranged above the process chamber 10. The magnet 18 forms a horizontal magnetic field which is located near the surface of the wafer 12 to be parallel (horizontal) therewith and crosses an electric field at a right angle. The magnet 18 can be rotated by a motor M in a direction indicated by an arrow in FIG. 4, thus forming a uniform magnetic field B throughout the surface of the wafer 12. With this orthogonal electromagnetic field, a magnetron discharge can be performed, and low-pressure etching can be performed.

In order to perform etching with higher anisotropy, the wafer 12 can be controlled to a desired temperature. This temperature control means can be realized in such a manner that the mount table 14 is cooled by a refrigerant flow, the wafer 12 is then brought into tight contact with the mount table 14, and a gas, e.g., He gas as an inert gas, is supplied between the lower surface of the wafer 12 and the mount table 14.

A window portion 10a is formed in the process chamber 10 to detect an end-point of an etching process by a plasma generated in the process chamber 10. A end-point detecting apparatus (EPD) 20 including a sensor for photoelectrically converting light having a specific wavelength in a plasma is arranged to oppose the window portion 10a. This light having the specific wavelength ($\lambda$) is dependent on a volatile substance produced by plasma etching. For example, in Al-Si etching, $\lambda = 261.4$ nm. As a sensor 32, for example, a monochromator selected/set to this specific wavelength may be used.

Figure 1:
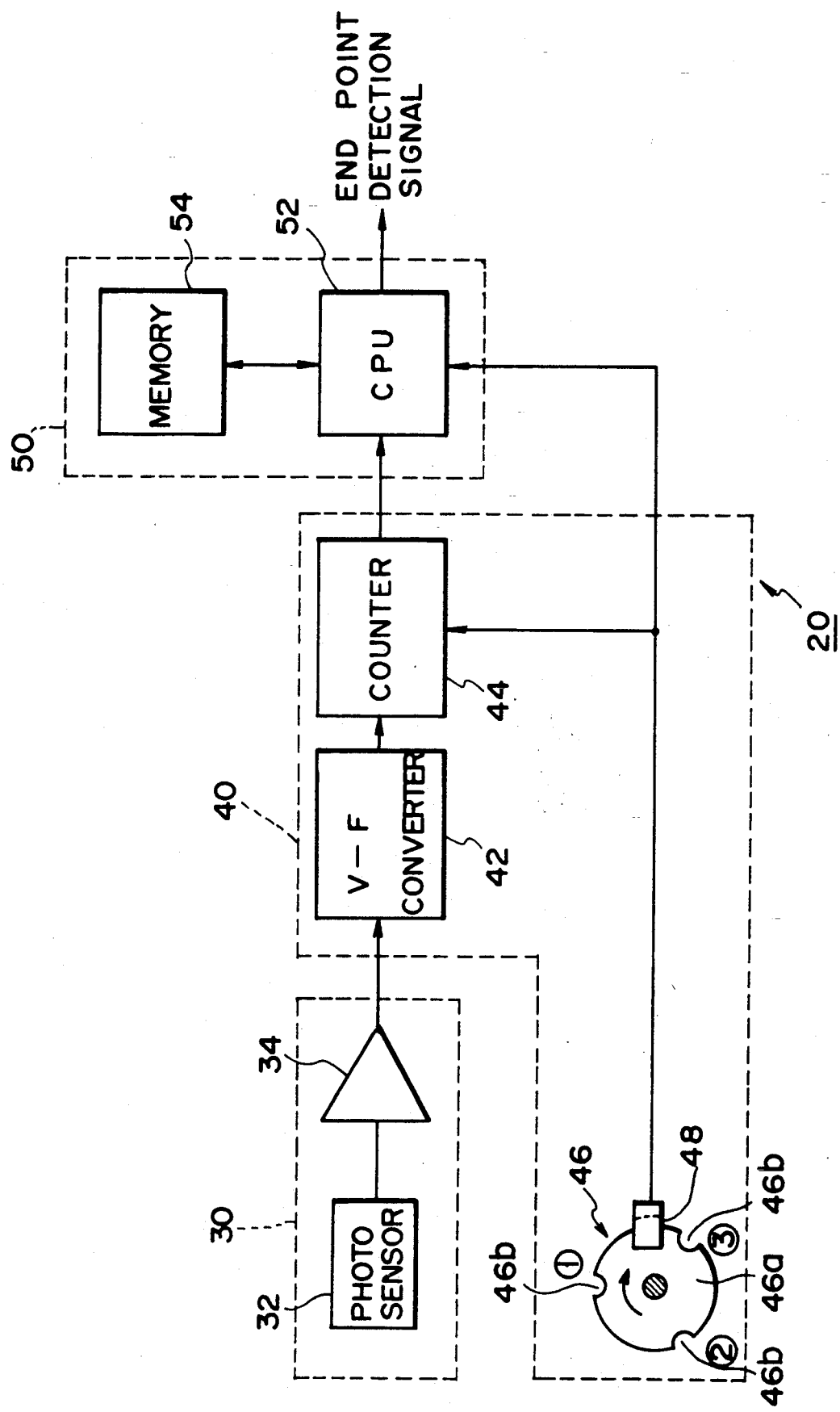
FIG. 1 is a block diagram showing a plasma process end-point detecting apparatus according to an embodiment of the present invention.

The EPD 20 will be described below with reference to FIG. 1.

The EPD 20 comprises a sensor section 30 for converting plasma light into an electrical signal, a smoothing section 40 for smoothing an output from the sensor section 30, and an end-point detecting section 50 for automatically detecting an etching end-point.

The sensor section 30 is constituted by a light-receiving sensor 32, arranged to face the transparent window portion 10a, e.g., a quartz glass window for transmitting light having a predetermined wavelength, of the process chamber 10 shown in FIG. 4, for receiving light having a specific wavelength in a plasma in the process chamber 10 through the window portion 10a formed at one portion, converting the light into an electrical signal corresponding to its light intensity, and outputting it, and an amplifier 34 for amplifying the sensor output to increase its amplitude to a value required for predetermined signal processing. Note that plasma light may be received through a plurality of portions or a plurality of windows.

The smoothing section 40 is constituted by a V-F converter 42 for outputting a pulse signal having a frequency corresponding to, e.g., an output voltage from the amplifier 34 (e.g., 10 V/20 kHz), a counter 44 for counting output pulses from the V-F converter 42, and an encoder 46 for defining a fetch timing of a count pulse with respect to the counter 44. The encoder 46 comprises, e.g., a disk 46a fixed to the rotating shaft of the magnet 18, three notched portions 46b formed in a peripheral portion of the disk 46a at angular intervals of 120°, and a photointerrupter 48, constituted by light-emitting and light-receiving elements respectively arranged above and below the path of the notched portions 46b, for detecting the rotational speed of the magnet 18.

In this embodiment, the rotational speed of a magnetic field, i.e., the rotational speed of the magnet 18 rotated by the motor M, is set to be, e.g., 20 rpm. That is, the magnet 18 is rotated once every three seconds. Therefore, one pulse is output from the photointerrupter 48 of the encoder 46 per second. Note that these numerical values are to be set in relation to the determination of a sensing rate with respect to light having a specific wavelength (to be described later). The rotational speed of the magnet 18 is set to be 1 to 100 rpm, preferably, 20 to 50 rpm, and the sensing rate is set to be 3 times/minute to 300 times/minute, preferably, 60 times/minute to 150 times/minute.

The counter 44 sequentially counts pulse signals output from the V-F converter 42 in accordance with an electrical signal from the light-receiving sensor 32, thus outputting a signal obtained by integrating (smoothing) the sensor output throughout the duration of a rotation period T of the magnet 18 in FIG. 2 showing an enlarged graph of a light intensity signal shown in FIG. 3, i.e., a signal corresponding the area of a hatched portion in FIG. 2.

The end-point detecting section 50 comprises an arithmetic control unit (CPU) 52 for automatically detecting an etching end-point by collating an output from the counter 44 with information stored in advance, and a memory 54 for storing comparative information used for detecting an end-point.

The CPU 52 has the following functions:

(a) starting to fetch outputs from the counter 44 from the start time of a steady state of a plasma process shown in FIG. 3, i.e., time $t_1$, and storing the average value of the outputs in the steady state, as the comparative information, in the memory 54; and (b) outputting an end-point detection signal at the time when integral data output from the counter 44 reaches 60% with respect to the comparative information, provided that the comparative information is considered as 100%, i.e., at time $t_2$ in FIG. 3.

An operation of the apparatus of this embodiment will be described next.

The process chamber 10 is evacuated first to a predetermined degree of vacuum. A process gas is then introduced into the process chamber 10. Subsequently, RF power is supplied to the mount table 14 to form a vertical electric field on the wafer 12 on the mount table 14. In addition, the magnet 18 is rotated to form a uniform magnetic field in a direction parallel (horizontal) to the surface of the wafer 12 while the magnetic field is rotated/moved, thus forming a plasma against the wafer 12.

With this operation, plasma etching with respect to the wafer 12 is executed.

Although the horizontal, uniform magnetic field can be formed near the surface of the wafer 12 by rotating the magnet 18, the plasma is rotated and moved synchronized with the rotation of the magnetic field by rotating the magnet 18, and the magnetic field is also rotated and moved. A plasma process end-point is to be detected by detecting the intensity of light having a specific wavelength (e.g., 261.4 nm as described above) which is dependent on an etching substance, i.e., a volatile substance, in the plasma. In this embodiment, plasma process end-point detection is performed in the following procedure.

The light-receiving sensor 32 fixed to oppose the window portion 10a of the process chamber 10 detects the intensity of light having a specific wavelength in a plasma at a specific portion, e.g., a narrow portion in the process chamber 10. Therefore, when the plasma is rotated/moved upon rotation of the magnet 18, and a plasma region is directly located within the field of view of the light-receiving sensor 32, the output from the sensor 32 is increased. That is, the output from the light-receiving sensor 32 includes a variation component synchronized with the rotational speed of the magnet 18, as shown in FIG. 3. As indicated by the enlarged graph of FIG. 2, this variation component can be regarded as a sine curve having the rotation period T of the magnet 18 as its period.

The present invention employs a technique of smoothing an output from the light-receiving sensor 32, which includes such a variation component in the form of a sine wave by basically performing analog/digital (A/D) conversion.

In this embodiment, the average value of the intensity of light having a specific wavelength in a plasma in a steady state of a plasma process is obtained on the basis of a smoothed output (to be described later), and the average value is stored, as comparative information for plasma process end-point detection, in the memory 54 of the end-point detecting section 50. Since time $t_1$ at which a steady state of a plasma process is realized can be predicted in advance, the CPU 52 starts a plasma process end-point detecting operation after time $t_1$.

An operation of the smoothing section 40 including the counter 44 will be described below. An output voltage from the amplifier 34 is proportional to the sensor output representing the intensity of the light having the specific wavelength in the plasma, which is shown in FIG. 3. The V-F converter 42, to which this voltage is applied, uses one of A/D conversion techniques to sequentially output pulse signals whose frequencies are increased with an increase in input voltage. That is, the V-F converter 42 converts an input voltage into a digital signal. The counter 44 counts the pulses sequentially output from the V-F converter 42. This operation is substantially equivalent to an operation of outputting the sensor output as a smoothed, i.e., integrated signal, throughout the duration of the rotation period T of the plasma, as shown in FIG. 2. Various schemes may be used to smooth the sensor output by using the counter 44. For example, a reset operation is performed every time a pulse from the encoder 46 is input, and count values reset by three pulses ①, ②, and ③ in one period T of the magnet 18 are output to the CPU 52. The CPU 52 then obtains the sum of these three count values as integral data within one period. Data obtained by repeating such processing is data whose variation component dependent on the rotation of a magnetic field is smoothed, as indicated by a dotted line in FIG. 3, thereby eliminating the error factor in plasma process end-point detection. Alternatively, the counter 44 may be arranged as an infinite counter so that the counter 44 is reset by the first pulse output from the encoder 46 after time $t_1$ as the start time of a steady state of a plasma process, and a value obtained by counting pulses sequentially output from the V-F converter 42 is subsequently output to the CPU 52. The CPU 52 then calculates the difference between the count values within one period T, thus forming integral data in one period T. The CPU 52 calculates the average value of the integral data obtained by a predetermined number of operations in the steady state of the plasma process to obtain comparative information for plasma process end-point detection. The CPU 52 stores the obtained information in the memory 54. When a predetermined material is etched by a plasma process, and the etching of the material is completed, light having a wavelength specific to the material exhibits a relatively large decrease in intensity. An etching end-point is detected by detecting this change in intensity.

Upon registration of the comparative information, the CPU 52 sequentially inputs smoothed data in one period T of the magnet 18 through the counter 44, and compares it with the comparative information. When the input smoothed data reaches 60%, for example, provided that the comparative information is 100%, the CPU 52 outputs a plasma process end-point detection signal, thus completing accurate end-point detection of the etching process performed by the magnetron plasma etching apparatus.

In the above embodiment, an end-point detecting value is determined at 60% of the comparative information (100%). However, this value may be determined at 90% value, and 120% up value may be used, vice versa.

The present invention is not limited to the above-described embodiment. Various changes and modifications can be made within the scope of the invention.

The plasma process end-point detection of the present invention can be applied to not only the magnetron plasma etching apparatus as in the above embodiment but also an apparatus for performing various types of processes by using at least a plasma. In addition, a means for rotating a magnetic field is not limited to the means for mechanically rotating the magnet 18 as in the above embodiment. Instead of using this means, a magnetic field generating means may be constituted by a coil, and its line of magnetic force may be rotated by a current supply scheme.

If the present invention is applied to a general plasma etching apparatus, the magnet 18 shown in FIG. 4 may be omitted.

As has been described above, according to the present invention, in a case wherein a plasma is to be generated in, e.g., an electric field and a rotating magnetic field, even if the plasma is moved upon rotation of the magnetic field to produce a variation component in the intensity of plasma light, end-point detection with few errors can be realized by smoothing a sensor output signal obtained by detecting the intensity of light having a specific wavelength in the plasma, and detecting a plasma process end-point on the basis of the smoothed signal.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A plasma apparatus comprising:
   plasma generating means for generating a plasma in a process vessel;
   plasma process means for executing a plasma process with respect to a substance to be processed, by moving and rotating the plasma generated in the process vessel by the plasma generating means, said plasma process means including a magnet arranged rotatable in the process vessel for moving and rotating the plasma, and a driving mechanism for rotating the magnet in a predetermined cycle;
   sensor means for sensing a first electrical signal corresponding to an intensity of plasma light which the plasma in the process vessel produces and has a predetermined wavelength;
   detecting means for detecting a second electrical signal which is synchronous with rotation of the magnet;
   smoothing operation means, supplied with the first electrical signal sensed by the sensor means, for smoothing the first electrical signal in accordance with the second electrical signal detected by the detecting means, during at least one rotation period of the magnet; and
   end-point detecting means for detecting an end-point of the plasma process on the basis of an output signal from the smoothing operation means.

2. An apparatus according to claim 1, wherein said smoothing operation means includes:
   means for converting the first electrical signal sensed by the sensor means into pulse signals having a frequency corresponding to the voltage of the first electrical signal;
   means for counting the number of the pulse signals obtained by the converting means, in accordance with the second electrical signal detected by the detecting means; and
   means for integrating an output signal from the counting means during at least one rotation period of the magnet.

3. An apparatus according to claim 1, wherein said end-point detecting means includes:
   means for storing, as a comparative value, a steady-state value represented by the first electrical signal smoothed by the smoothing operation means; and
   means for outputting an end-point detection signal when the first electrical signal smoothed by the smoothing operation means has reached a predetermined value which is smaller than the comparative value stored in the storing means.

4. An apparatus according to claim 1, wherein the second electrical signal output by the detecting means takes a predetermined sensing rate within the range of 3 times/minute and 300 times/minute when one rotation period of the magnet is of a predetermined value within the range of 1 to 100 rpm.

5. An apparatus according to claim 1, wherein said detecting means includes encoder means.

6. An apparatus according to claim 5, wherein said encoder means includes:
   a disk member coupled to a rotating shaft of the magnet and having a plurality of slits formed therein; and photointerrupter means located in a portion corresponding to a path in which the slits of the disk member are movable.

7. An apparatus according to claim 1, wherein:
said detecting means includes means for outputting second electrical signals at a plurality of points which are determined within one rotation period of the magnet; and
said smoothing operation means performs a smoothing operation at the points determined within one rotation period of the magnet.

8. A plasma apparatus comprising:
plasma generating means for generating a plasma in a process vessel;
plasma process means for executing a plasma process with respect to a substance to be processed, by moving and rotating the plasma generated in the process vessel by the plasma generating means, said plasma process means including a magnet arranged rotatable in the process vessel for moving and rotating the plasma, and a driving mechanism for rotating the magnet;
sensor means for sensing a first electrical signal corresponding to an intensity of plasma light which the plasma in the process vessel produces and has a predetermined wavelength;
detecting means for detecting a second electrical signal which is synchronous with rotation of the magnet;
smoothing operation means, supplied with the first electrical signal sensed by the sensor means, for smoothing the first electrical signal in accordance with the second electrical signal detected by the detecting means, during at least one rotation period of the magnet; and
end-point detecting means for detecting an end-point of the plasma process on the basis of an output signal from the smoothing operation means,
wherein said detecting means includes encoder means for outputting second electrical signals at a plurality of points which are determined within one rotation period of the magnet; said encoder means includes a disk member coupled to a rotating shaft of the magnet and having a plurality of slits formed therein, and photointerrupting means located in a portion corresponding to a path in which the slits of the disk member are movable, and said smoothing operation means performs a smoothing operation at the points determined within one rotation period of the magnet.

9. An apparatus according to claim 8, wherein said smoothing operation means includes:
means for converting the first electrical signal sensed by the sensor means into pulse signals having a frequency corresponding to the voltage of the first electrical signal;
means for counting the number of the pulse signals obtained by the converting means, in accordance with the second electrical signal detected by the detecting means; and
means for integrating an output signal from the counting means during at least one rotation period of the magnet.

10. An apparatus according to claim 8, wherein said end-point detecting means includes:
means for storing, as a comparative value, a steady-state value represented by the first electrical signal smoothed by the smoothing operation means; and
means for outputting an end-point detection signal when the first electrical signal smoothed by the smoothing operation means has reached a predetermined value which is smaller than the comparative value stored in the storing means.

11. An apparatus according to claim 8, wherein the second electrical signal output by the detecting means takes a sensing rate predetermined within the range of 3 times/minute and 300 times/minute when the rotation period of the magnet is a value predetermined within the range of 1 to 100 rpm.

* * * * *